(12) United States Patent
Gerber et al.

(10) Patent No.: US 6,222,761 B1
(45) Date of Patent: Apr. 24, 2001

(54) METHOD FOR MINIMIZING PROGRAM DISTURB IN A MEMORY CELL

(75) Inventors: Donald S. Gerber, Gilbert; Kent Hewitt; Jeffrey A. Shields, both of Chandler, all of AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 09/617,281

(22) Filed: Jul. 17, 2000

(51) Int. Cl.[7] .................................................. G11C 16/04
(52) U.S. Cl. ................................. 365/185.02; 365/185.29
(58) Field of Search .......................... 365/185.02, 185.11, 365/185.18, 185.26, 185.29, 185.33

(56) References Cited

U.S. PATENT DOCUMENTS

| | | | |
|---|---|---|---|
| 5,464,999 | * 11/1995 | Bergemont | 365/185.26 |
| 5,612,913 | * 3/1997 | Cappelletti et al. | 365/185.18 |
| 5,790,455 | 8/1998 | Caywood | 365/185.27 |
| 5,818,757 | 10/1998 | So et al. | 365/185.18 |
| 5,986,931 | 11/1999 | Caywood | 365/185.06 |
| 6,101,131 | * 8/2000 | Chang | 365/185.29 |

* cited by examiner

*Primary Examiner*—Trong Phan
(74) *Attorney, Agent, or Firm*—Swidler Berlin Shereff Friedman LLP

(57) ABSTRACT

A method of applying voltages to a memory cell, such as a P-channel EEPROM cell, and in particular to applying voltages to the cell during an erase operation of the cell is described. The method recognizes that during an erase, memory cells sharing deselected word lines are susceptible to a type of program disturb which is subtle and gradually causes corruption and loss of data over many programming cycles. The method of the present invention applies a voltage to deselected word lines, which is lower in magnitude than a programming voltage. This reduces the rate at which program disturb occurs, markedly increasing the number of programming cycles to which the deselected cells may be subjected before becoming susceptible to loss of data. The endurance of the memory array is thus significantly extended.

16 Claims, 11 Drawing Sheets

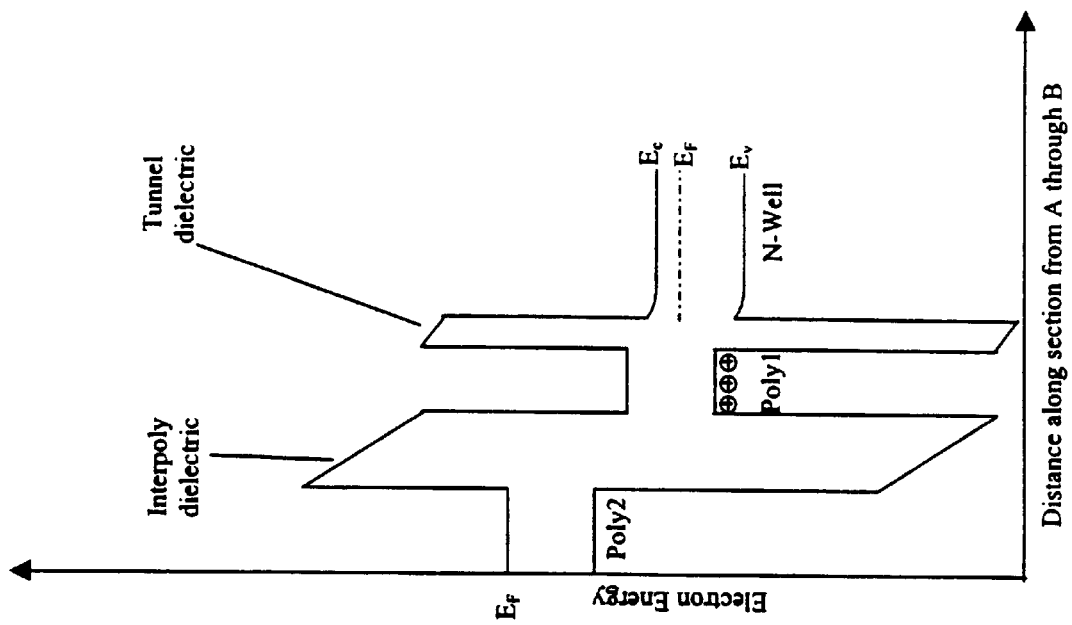
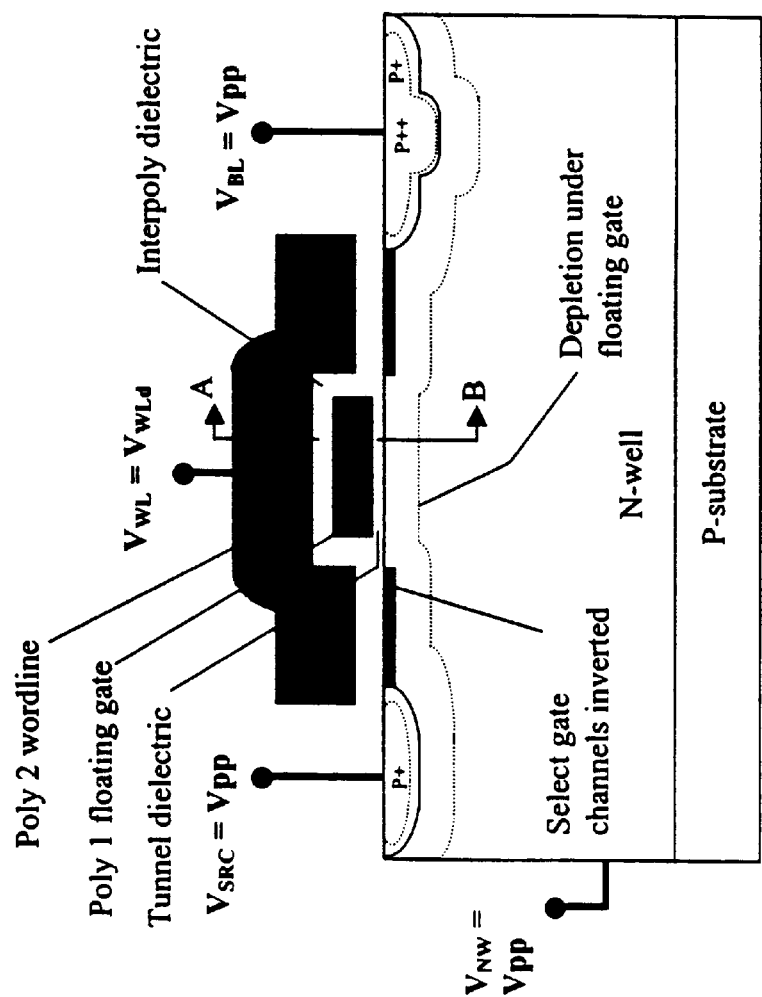
Figure 10(b)
Figure 10(a)

US 6,222,761 B1

METHOD FOR MINIMIZING PROGRAM DISTURB IN A MEMORY CELL

BACKGROUND OF THE INVENTION

The present invention relates to an improved method for erasing and writing information in an electrically alterable memory, and more particularly to a method of erasing and writing information in an electrically erasable programmable read only memory ("EEPROM").

We have discovered a unique solution to the "program disturb" problem in memory cells such as those in current P-channel EEPROM structures. Program disturb occurs when there is a write or erase to a selected group of cells in an array, and the state or content of other, nonselected cells, which is supposed to be left unchanged, is unintentionally changed. The program disturb of such other, non-selected cells may not occur as a result of one programming cycle. The unwanted change may occur incrementally and gradually over many (even millions of) programming cycles. The program disturb problem can be quite subtle and difficult to observe, but can be severely limiting for some applications of the cell.

We use the nomenclature for electrical operations performed upon an array of memory cells in a slightly different manner than typically occurs. We use here the term "write" to refer to an operation of placing electrons onto a floating gate. We use the term "erase" to refer to an operation of removing electrons from a floating gate. The term "program" as used here refers to one cycle of cell programming, which includes a write operation and an erase operation.

This invention represents an improvement upon the structure and operation described in the following patents: U.S. Pat. No. 5,790,455, "Low Voltage Single Supply CMOS Electrically Erasable Read-Only Memory;" U.S. Pat. No. 5,986,931, "Low Voltage Single CMOS Electrically Erasable Read-Only Memory;" and in the following patent applications: U.S. patent application Ser. No. 09/262,675, and entitled "Independently Programmable Memory Segments within a PMOS Electrically Erasable Programmable Read Only Memory Array Achieved by N-well Separation and Method Therefor," Filed Mar. 19, 1999; and U.S. Patent Application filed concurrently herewith, and entitled "Improved Programming Method for a Memory Cell", both applications assigned to the same assignee as the present application. Based on these two patents and applications, the following summarizes the overall structure of an EEPROM memory array and the voltages applied to it during the write and erase operations.

The program disturb problem occurs because groups of cells share a number of common connections, including: a bit line, a word line, a source line, and an N-well. However, cells need to share these connections in order to make the memory array compact and to reduce the number of signal lines routed into it. So, an understanding of the structure and operation of a current memory array is useful for understanding how the disturb problem arises and how the present invention addresses this problem.

FIG. 1 is a circuit schematic diagram of a p-channel memory cell, which will be referred to as the PEEC cell (p-channel EEPROM Cell). FIG. 2 is a schematic cross-section diagram of the PEEC cell, along the channel of the FIG. 1 device and in a direction parallel to the bit line. By comparing FIGS. 1 and 2, a correspondence can be seen between the various symbolic representations of the cell components in FIG. 1 with their physical embodiment in the cross-section of FIG. 2. For example, the source and drain of the cell are represented by simple lines on either side of the word line in FIG. 1 and these are actually p-type diffusions in an n-well shared by many memory cells as depicted in FIG. 2. In fact, each source and drain diffusion is actually shared by two adjacent cells. The "fragments" of poly 2 to the left and right of the poly 2 word line of the cell in the center of the diagram indicate this. In FIG. 1, it can be seen that there are four terminals to the cell: (1) the poly 2 word line that is shared by a row of cells, (2) the source that is connected to the metal source line, (3) the drain that is connected to the metal bit line, and (4) the N-well body that is a region of n-type silicon shared by several columns of cells. Physically, the metal bit line and source line run parallel to each other in pairs down each column of the array. Each column of cells has one bit line and one source line.

In FIG. 2, the cross-section is along and through the bit line so the metal line is visible in the cross-section. The metal source line and its contact to the source p+ region is not visible in FIG. 2 because it is parallel to the bit line and out of the plane of the paper. FIG. 1 also indicates where voltages are applied to the PEEC cell to program or read the cell information. These voltages are labeled $V_{BL}$ (the voltage on the bit line), $V_{NW}$ (the voltage on the shared N-well region), $V_{SRC}$ (the voltage on the source line), and $V_{WL}$ (the voltage on the word line).

FIG. 3 is a schematic diagram of a portion of a large memory array. An N-well region is depicted as a dashed line box surrounding a large group of memory cells. In the figure, two N-wells, labeled N-well #0 and N-well #1, are shown. N-well #0 contains eight complete columns of cells. N-well #1 would normally also contain eight columns of cells, but only 4 columns are shown due to space limitations in the figure. Eight columns are shown as being contained in one N-well because this is the typical size of a "byte" or "word" of information. One "byte" or "word" would actually be the number of cells along the intersection of one word line with the number of columns in one N-well. Thus, one N-well contains many bytes or words, corresponding to the many word lines that cross the N-well. However, any number of columns could be contained in a single N-well (i.e. the "byte" or "word" size could be 14, 16, 32, or any number desired for the product). Also, there could be any number of N-well segments in the large array. Only two are shown because this is sufficient for the present description.

In FIG. 3, only the top four and last two rows of cells (word lines) are shown due to space limitations. In this figure, it is assumed that there are n+1 word lines, numbered from 0 through n. The number n could be only a few, or it could be hundreds or thousands. The schematic diagram for one PEEC cell that appears in FIG. 1 can be seen repeated many times in the array depicted in FIG. 3. Cells in the same column share a bit line, a source line, and the N-well (note the three parallel lines running down each column). Cells in the same row share a word line (note the single horizontal line running along each row). All cells in the array are identified individually by the notation, $M_{x,y}$, where x=the row number and y=the column number.

At the bottom of each column, the last transistor is not a PEEC cell, but a source select transistor, denoted by the notation $Q_{z,y}$, where z=the N-well number and y=the column number. The source select transistor is, as taught in the prior art patents, used at the bottom of each column to separate the column source lines during the erase operation. Otherwise the undesirable condition of having the programming high voltage signal shorted to ground could occur. The source select transistor must be turned on to read a cell and off during the erase part of a programming cycle. This is accomplished by the line running left to right which connects all of the source select transistor gates, and has the voltage label at its terminus, $V_{sel}$. When the source select transistor is turned on, it connects the voltage, $V_{src}$, which is connected to all the source select transistors to the source lines. The voltages applied to the N-wells are labeled, $V_{NW0}$ and $V_{NW1}$. The voltages applied to the word lines are labeled, $V_{WL0}$, $V_{WL1}$, ..., $V_{WLn}$. The voltages applied to the bit lines are labeled, $V_{BL0}$, $V_{BL1}$, and so on. Many commercial products, such as "byte-selectable" or "full-featured" EEPROM memories, select and program only one byte of cells at a time, leaving all other bytes in the array unaltered.

In the memory cells described above, the write operation places electrons onto the floating gate of the memory cells being written. This causes a shift in the memory transistor threshold voltage to a low negative or perhaps a positive value. The merged select transistor in the cell prevents the overall cell threshold from becoming a positive value, however. The result of the write operation is that a cell becomes conductive during a subsequent read operation.

FIG. 4 is a schematic diagram corresponding to that of FIG. 3, but with the voltages that would be applied to execute a "write" operation of the target byte of cells enclosed by the bold rectangle. After executing the "write" the cells in the target byte would be placed into the conductive state during a subsequent read operation. All other bytes of cells in the array, termed "deselected" bytes, are intended to be left unaltered, the electronic charge stored on their floating gates being unchanged. The N-well of the byte to be written, N-well #0 in the example shown in the figure, is set at 0V and the N-wells of all other bytes which are deselected (unselected and not to be changed) are set at the programming voltage, Vpp. Vpp is the "high voltage" used in programming operations and typically lies in the range of 12 to 20V. The word line of the byte to be written is set at Vpp, and all unselected bytes have their word lines set at 0V. All bit lines are set to 0V. The source select line has $V_{sel}>=0V$ and the source line has $V_{src}=0V$. The source select transistors are all p-channel enhancement devices, meaning that they must have a gate-source voltage, $V_{gs}$, which is more negative than the threshold voltage, $V_{tp}$, of the device in order for their channels to be on ,i.e., conduct. The voltage conditions applied in the write operation cause the source select transistors of the selected byte ($Q_{0,0}$ through $Q_{0,7}$) to be non-conductive or off. Thus all of the source lines in the selected N-well (#0) are floating. The source select transistors in the unselected N-wells may be on or off, depending upon the exact value of $V_{sel}$. In any case, it is not critical whether these source select transistors are on or off and whether the source lines are floating or connected to 0V. The results for the write operation will be the same.

Since the memory cells and source select transistors in the deselected N-wells share the signal lines running horizontally in the array (e.g. the word lines) with the cells in the selected N-well (in FIG. 4, N-well #0), they must have their voltages set so as not to cause a change in the stored charge on the deselected or unselected memory cells. The word line voltage of the byte that is being written is at Vpp with the selected N-well at 0V in order to cause electrons to tunnel through the thin dielectric layer between the N-well and floating gate. This requires all deselected N-wells to have Vpp applied to them to avoid also writing the cells along the same word line (e.g. cells $M_{0,8}$ through $M_{0,11}$ in FIG. 4). The deselected word lines have 0V applied to them over the selected N-well to avoid writing the unselected cells. For cells in the deselected N-wells that receive Vpp, these same word lines have 0V. Thus the bit lines of the cells in the deselected N-wells must have 0V applied to them to avoid changing the charge on their floating gates. An example of one such cell is $M_{1,8}$. Its N-well is at Vpp and its word line is at 0V, causing the cell channel to be in inversion. With the bit line of this cell set to 0V, however, the inversion layer of charge present in the cell channel under the floating gate is also set to 0V since it is connected electrically to the bit line via the drain p-type diffused region. Thus the potential difference applied between the word line and inversion layer under the floating gate is 0V, and no inadvertent programming should occur.

The erase operation removes electrons from the floating gates of the cells being erased, giving them a high negative threshold voltage and causing them to be in the non-conductive state when read. FIG. 5 is a schematic diagram corresponding to FIG. 3, but with voltages applied for an erase operation. As with FIG. 4, a target byte is enclosed in a bold line rectangle. Unlike the write operation in which all cells in the target byte are set to the same predetermined state, the erase operation only erases cells in the target byte that are desired to be in the non-conductive state. The erase operation leaves the other cells in the target byte in the conductive state. This allows impressing a "bit pattern" into the byte of cells, with some in the binary "0" state and some in the binary "1" state. As noted above, a programming cycle includes writing all of the cells to a predetermined state (e.g., a conductive state) and then selectively erasing some of the cells to a non-conductive state, leaving the others unchanged. Only cells with their bit lines set to Vpp in the erase operation will be erased, those with bit lines set to 0V will be left in the written state. In the example shown in FIG. 5, only cells $M_{0,0}$ and $M_{0,2}$ will be erased in the target byte. The target byte has its N-well set at Vpp and its word line set at 0V. Deselected word lines are set at Vpp and $V_{sel}=Vpp$, so that all source select transistors are off and all source lines are disconnected from $V_{src}$. Comparing FIGS. 4 and 5, it can be seen that the deselected N-wells (N-well #1) and their associated bit lines have the same voltages applied in the erase operation as in the write operation. The main difference these deselected cells see is a reversal of the word line voltages with the word line of the target byte set to 0V instead of Vpp and the deselected word lines set to Vpp instead of 0V. The same approach to preventing unwanted erasing of the cells in these deselected N-wells as for a write operation applies to the erase operation as well. It should be noted that all of the above is discussed in U.S. Pat. No. 5,986,931 (in particular, FIG. 21, table 8 and text column 22 of the patent). That Patent does not disclose the voltages applied to the deselected N-wells (for example, N-well #1 in FIG. 4) and the bit lines contained within them.

The read operation involves applying only low voltages to the array to detect which memory cells are conductive and which are non-conductive. The details of reading the cell are well known and not important for an understanding of the present invention.

SUMMARY OF THE INVENTION

It is an object of the present invention to provide a method of operating a memory cell to reduce the instance of program disturb.

It is another object of the present invention to provide a method of operating a memory to reduce the instance of program disturb that does not depend upon changing the size of a memory cell.

To achieve the above and other objects, the present invention provides a method of operating a memory including first and second groups of memory cells. Cells of the first group being formed in a first semiconductor region, including a target set of cells operatively coupled to a first word line and to respective first bit lines, and other cells of the first group operatively coupled to respective ones of the first bit lines and to respective ones of the remaining word lines. Cells of the second group being formed in a second semiconductor region, including a set of cells operatively coupled to the first word line and to respective second bit lines, and other cells of the second group operatively coupled to respective ones of the second bit lines and to respective ones of the remaining word lines. The method comprises applying a first voltage to the first word line; applying a second voltage to the first semiconductor region; applying selected voltages to the first bit lines; applying a fourth voltage to the second semiconductor region; and applying a fifth voltage to the remaining word lines. During a first time, the first and fourth voltages are substantially the same, and the second and the selected voltages are substantially the same, and the fifth voltage is also substantially the same as the second voltage. During a second time the second and fourth voltages are substantially the same and different from the first voltage, the fifth voltage is selected from the range of the first voltage to the second voltage, and the selected voltages being selected from the range of the first voltage and the second voltage.

To achieve the above and other objects, the present invention further provides a method of erasing memory cells formed in a semiconductor region. A first group of the cells operatively coupled to a first word line and to respective first bit lines, and other cells of the first group operatively coupled to respective ones of the first bit lines and to respective ones of the remaining word lines. Cells of a second group of memory cells operatively coupled to the first word line and to respective second bit lines, and other cells of the second group operatively coupled to respective ones of the second bit lines and to respective ones of the remaining word lines. The method comprises applying a first voltage to the word line; applying a second voltage to the semiconductor region; applying selected voltages to the first bit lines; applying a fourth voltage to the second bit lines; and applying a fifth voltage to the remaining word lines. The first and second voltages are different, the fourth and fifth voltages selected from the range of the first voltage to the second voltage, and the selected voltages being selected from the second and fourth voltages.

To achieve the above and other objects, the present invention provides a method of providing particular voltages to a memory cell, such as an EEPROM cell, during an erase operation of a memory cell. In a preferred embodiment of the invention, a p-channel EEPROM cell is written and erased by Fowler-Nordheim tunneling through a thin tunnel dielectric. The prior art teaches that deselected word lines during an erase operation receive a programming voltage, Vpp. Under these conditions, the memory cells sharing the deselected word lines are susceptible to a type of program disturb which is subtle and gradually causes corruption and loss of data over many programming cycles. The present invention recognizes this disturb mechanism and applies a deselected word line bias, $V_{WLd}$, which is lower in magnitude than Vpp. This has the effect of reducing the rate at which the program disturb occurs, markedly increasing the number of programming cycles to which the deselected cells may be subjected before becoming susceptible to loss of data. The endurance of the memory array is thus significantly extended.

The present invention can be applied to many types of memories, and in particular those memories that store information by storing charges in a cell transistor. As an example of an embodiment of the present invention, the following discusses the present invention in view of an illustrative structure of an EEPROM.

BRIEF DESCRIPTION OF THE DRAWINGS

FIGS. 10(a), 11(a), 12(a), and 13(a) are cross-sectional views of a cell along a deselected word line similar to FIG. 6, but with the different combinations of floating gate charge and $V_{BL}$.

FIGS. 10(b), 11(b), 12(b), and 13(b) are band diagrams respectively corresponding to FIGS. 10(a), 11(a), 12(a), and 13(a) viewed through the floating gate region of the channel and perpendicular to the surface (section A–B in the figures).

DETAILED DESCRIPTION OF THE PREFERRED EMBODIMENTS

Program disturb is the unintentional alteration of charge on the floating gate of a cell which is not in the target byte being programmed during the programming cycle. Program disturb can occur during the write or erase operations and may occur incrementally, requiring many programming cycles before the threshold voltage of the cell is shifted enough to read a different binary state than originally programmed. While it is not obvious even to those experienced in the field of the invention, program disturb can take place with the erase conditions applied in FIG. 5.

Figure 2:
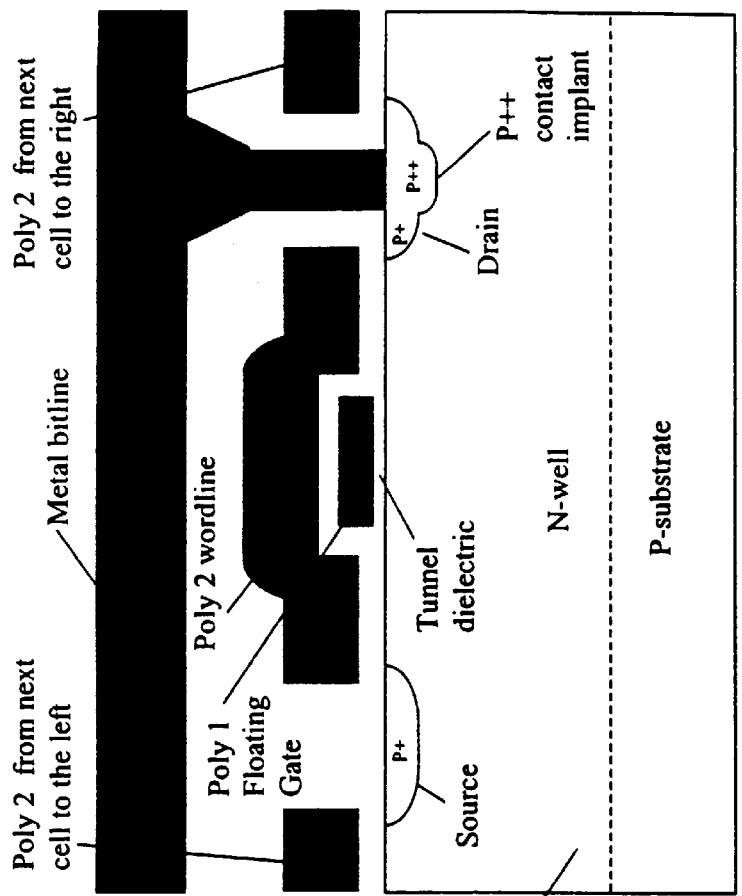
FIG. 2 is a schematic cross-section diagram of the PEEC cell, along the channel of the FIG. 1 device and in a direction parallel to the bit line.
Figure 1:
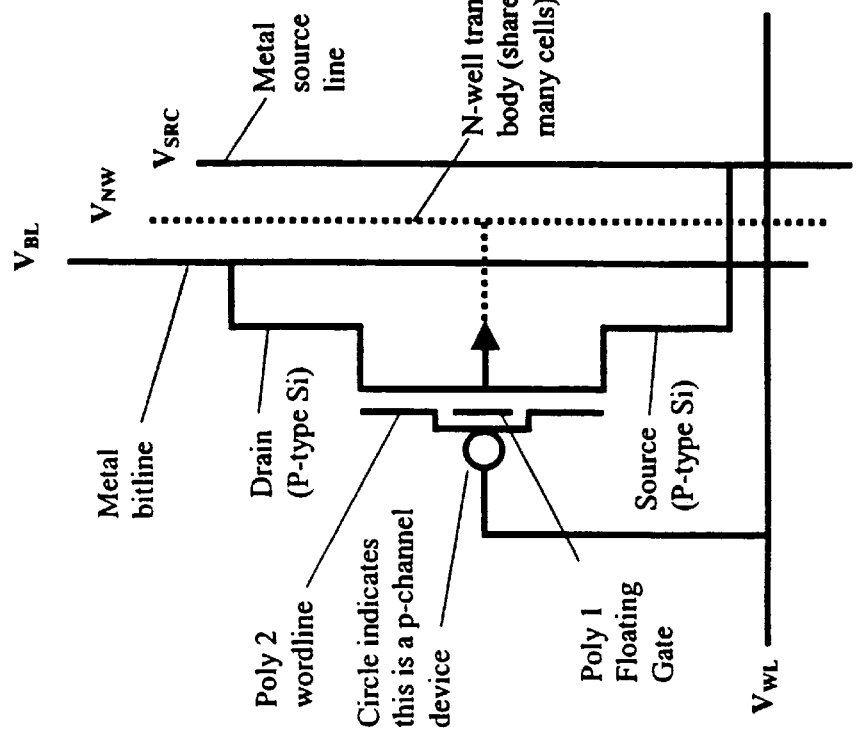
FIG. 1 is a circuit schematic diagram of a p-channel memory cell.
Figure 3:
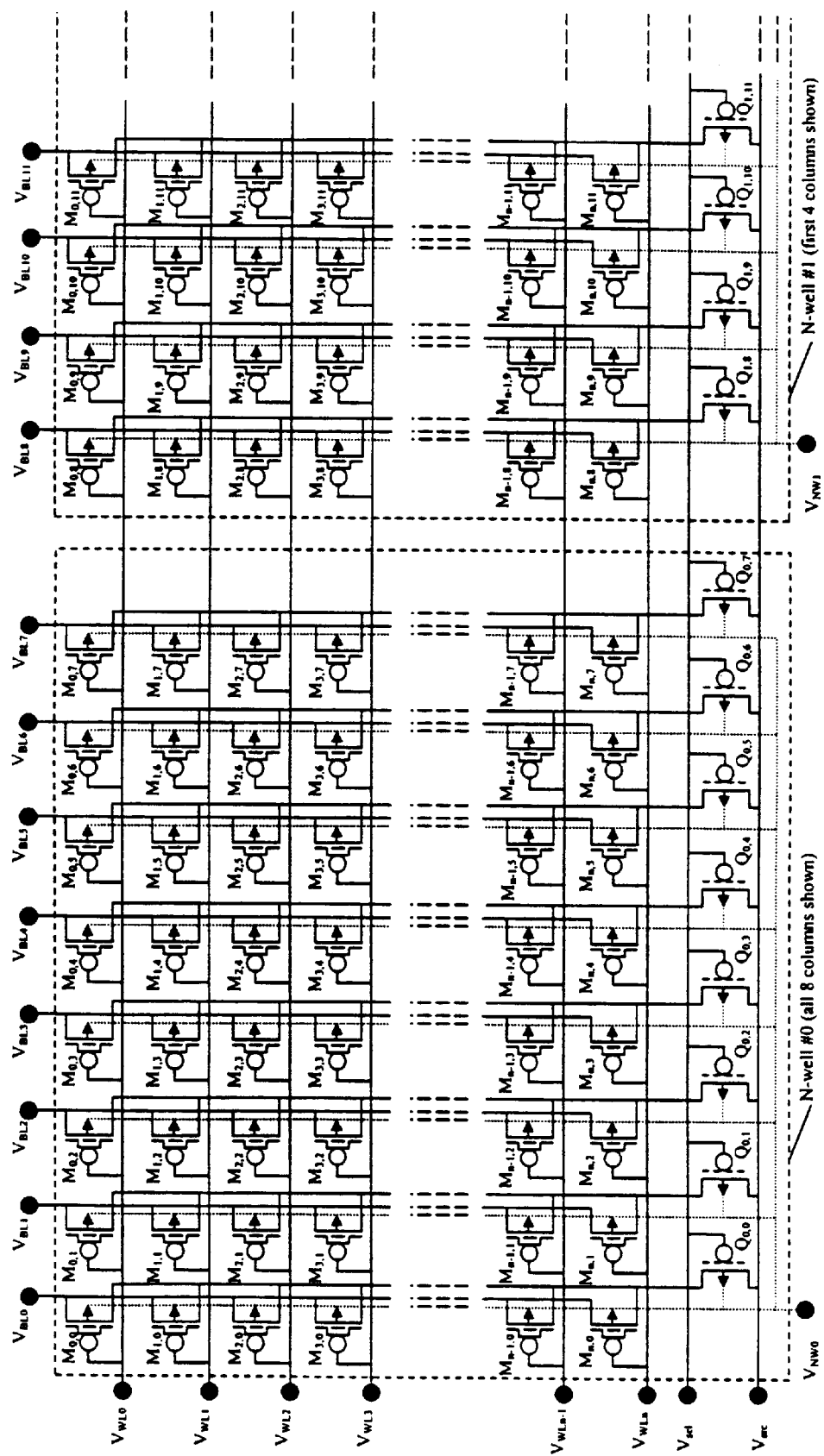
FIG. 3 is schematic diagram of a portion of a large memory array.
Figure 4:
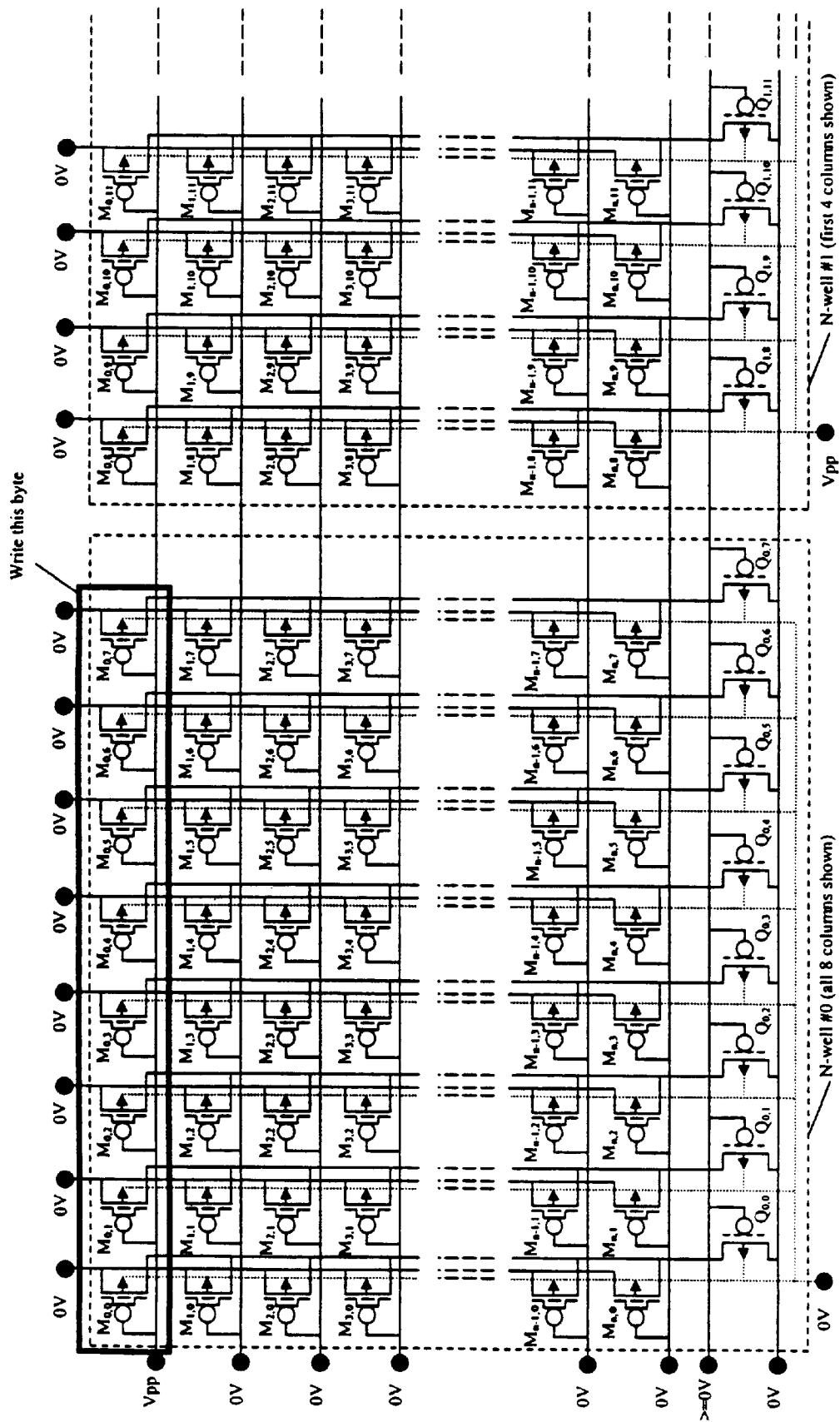
FIG. 4 is a schematic diagram corresponding to FIG. 3, but with the "write" voltages applied to a selected group of cells enclosed by the bold rectangle.
Figure 5:
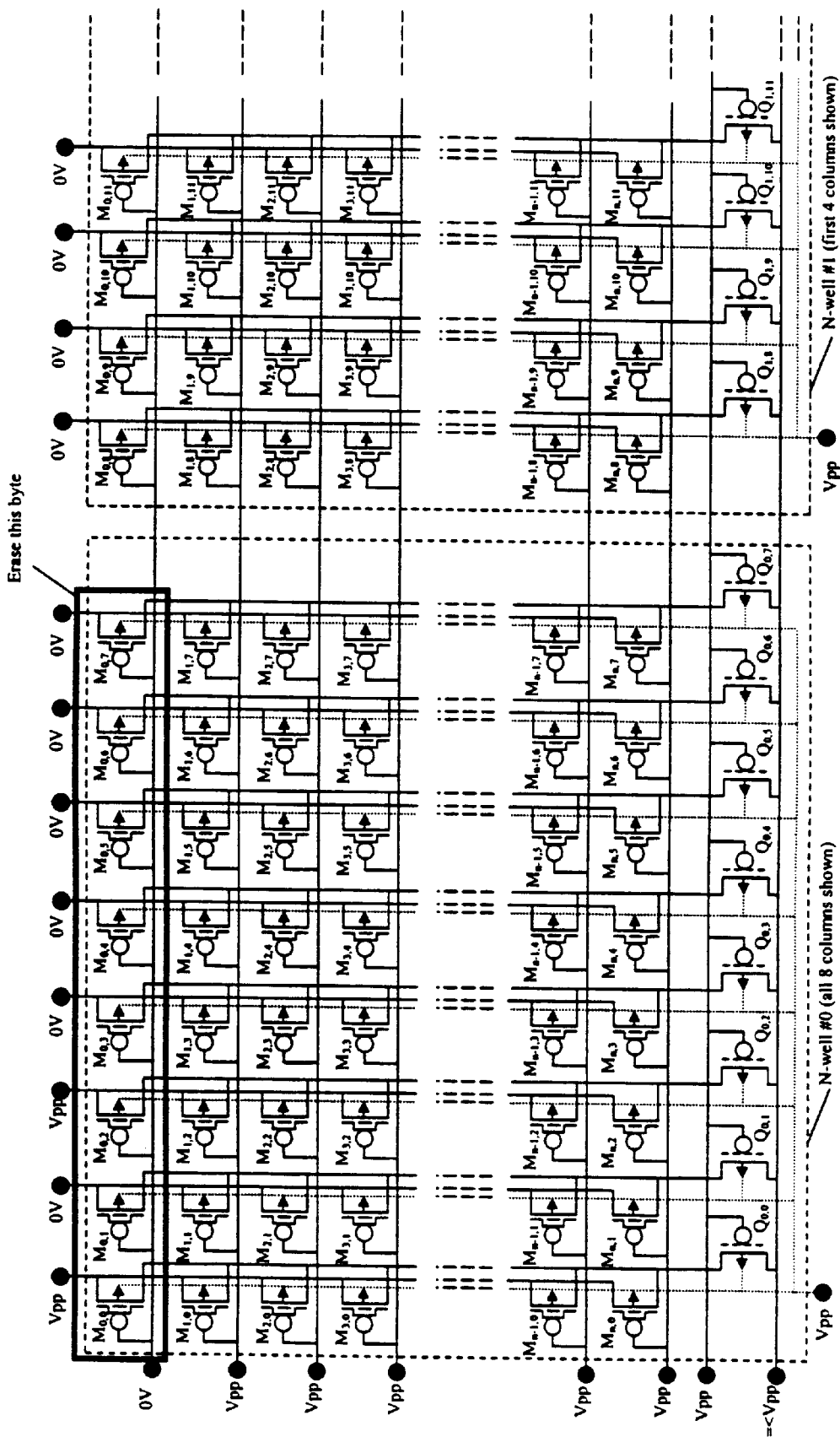
FIG. 5 is a schematic diagram corresponding to FIG. 3, but with the "erase" voltages.

FIG. 5 schematically shows the voltages applied to the cells for an erase operation. An example of a cell which is affected by the program disturb mechanism is $M_{1,8}$ in the figure. This cell has the N-well and word line both set to Vpp and the bit line set to 0V.

Figure 6:
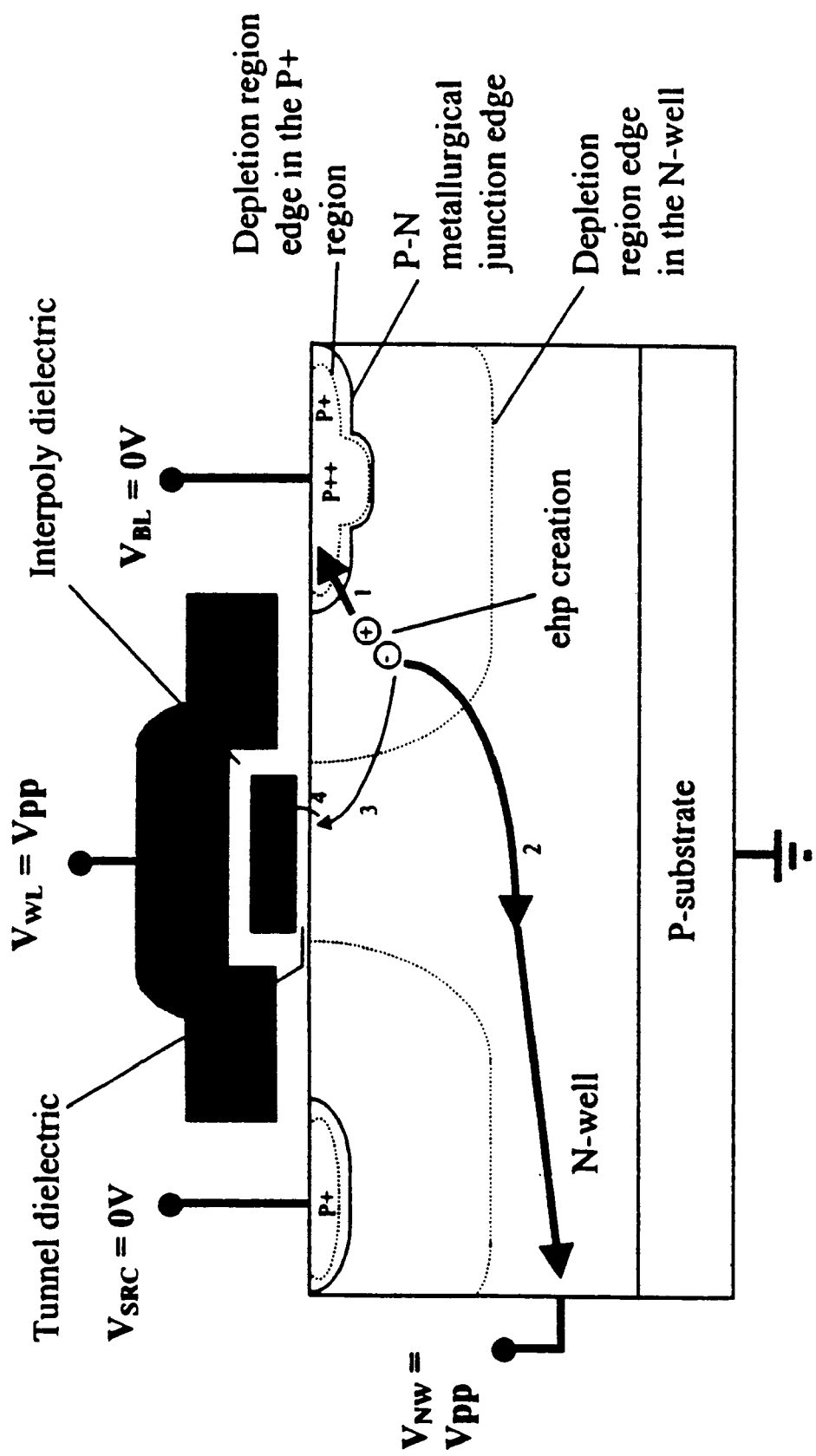
FIG. 6 is a cross-sectional view of one of the cells, $M_{1,8}$, $M_{1,9}$, $M_{1,10}$, or $M_{1,11}$ in FIG. 5.

FIG. 6 is a cross-sectional view of the cell $M_{1,8}$ shown in FIG. 5, with the set of applied voltages listed above. In the figure, the metallurgical junction boundary (solid line) is shown as are the limits of the depletion region (dashed lines) which extends into both the P+ side of the junction and the N-well side of the junction. As one of ordinary skill in the art of semiconductor device physics can appreciate, the depletion region extends much further into the N-well side of the p-n junction, than the P+ side due to the typically much lower doping concentration in the N-well versus the P+ regions that form the drain and source. It is assumed in the figure that the cell under examination is in the erased charge state with a net positive charge on the floating gate in this example. This is symbolized with the row of "+" signs on the floating gate. The actual potential of the floating gate is a fuiction of the net charge on it and the potentials of the N-well and word line which couple their potentials to it capacitively. If there were zero net charge on the floating gate and both the N-well and word line are at Vpp as shown in the figure, then the floating gate potential would also be approximately at Vpp. Since there is assumed a net positive charge on the floating gate, however, the floating gate potential is at some value greater than Vpp. For an erased cell the potential due to charge on the floating gate would typically lie in the range of +2V to +6V. Thus, the actual potential of the floating gate with the applied voltages shown in the figure would lie in the range of Vpp+2V to Vpp+6V. Even though the same voltage is placed on both the N-well below the floating gate and the word line surrounding it, there is an electric field across the tunnel dielectric between the floating gate and N-well. The direction of the electric field is such as to cause electrons to be attracted to the N-well surface under the floating gate. However, the field is not large enough to cause the normal Fowler-Nordheim tunneling of electrons across the tunnel dielectric and onto the floating gate as is used in the write operation. This lack of tunneling is true as long as the conduction electrons in the N-well have energies near the conduction energy band in the N-well. If a portion of the conduction band electron population is given sufficient energy above the conduction band energy level, though, some electrons may have enough energy to surmount the energy barrier between the conduction bands of the silicon N-well and the tunnel dielectric. If the tunnel dielectric were SiO2, this barrier height would be approximately 3.2 eV. Having surmounted the energy barrier, these energetic or "hot" electrons are then able to make their way through the tunnel dielectric and onto the floating gate. They would then begin to compensate the positive charge initially present on the floating gate. If enough electrons surmount the energy barrier and collect on the floating gate over time, then the charge state of the memory cell will change, during a subsequent read, from the non-conductive erased state to the conductive written state, resulting in a loss or corruption of the stored data.

As noted above, if electrons with energy sufficiently greater than the silicon conduction band energy were present in the N-well near the floating gate, they could surmount the tunnel dielectric barrier and change the charge on the floating gate. Attention is now focused on how these energetic electrons could be created in the N-well. Those with ordinary skill in the art of semiconductor device physics know that there are a number of mechanisms by which electron-hole pairs (ehp) can be created in a reverse biased P-N junction depletion region. The most important mechanisms are: (1) thermal generation, (2) impact ionization, (3) band-to-band tunneling, and (4) optical excitation. It is reasonable to eliminate optical excitation as an important mechanism for the present discussion because in the EEPROM products of interest in this invention, light is typically shielded out by the packaging materials used to surround the chip.

FIG. 6 schematically illustrates the creation of electron-hole pairs in the drain junction depletion region with the electrons and holes represented by a circle with a "−" sign and "+" sign, respectively. Electron-hole pairs may be created by any of the three mechanisms described above. In this cell, there is no channel current flowing during either write or erase, so the energetic or "hot" electrons are not generated by impact ionization due to any kind of channel current, as in common flash EEPROM cells. The energetic electrons are only those generated in the simple reverse-biased p-n junction by the mechanisms described above. Once created, the holes are swept toward the p-side of the junction and the electrons toward the n-side by the electric field in the depletion region. The holes enter the neutral region of the P+ drain junction and flow out the drain contact (arrow labeled 1). The vast majority of electrons enter the neutral region of the N-well and flow out the N-well contact (arrow labeled 2). Some of the electrons which enter the neutral N-well region are attracted toward the surface by the positively charged floating gate or have their momentum directed toward the surface by elastic collisions with lattice sites or Coulombic scattering events with ionized dopant atoms (arrow labeled 3). The population of electrons that arrive at the silicon-tunnel dielectric interface do not all have the same energy. As electrons generated in the depletion region gain energy due to acceleration by the electric field, they undergo scattering events that cause them to lose some of the energy gained. Statistically, some electrons will lose more energy than others. Thus, it can be appreciated that there is a distribution of energies among the electrons entering the neutral N-well from the depletion region with many having insufficient energy to surmount the barrier at the interface. There will be some, however, that do have sufficient energy to surmount the barrier and add their charge to the floating gate (arrow labeled 4).

Figure 9:
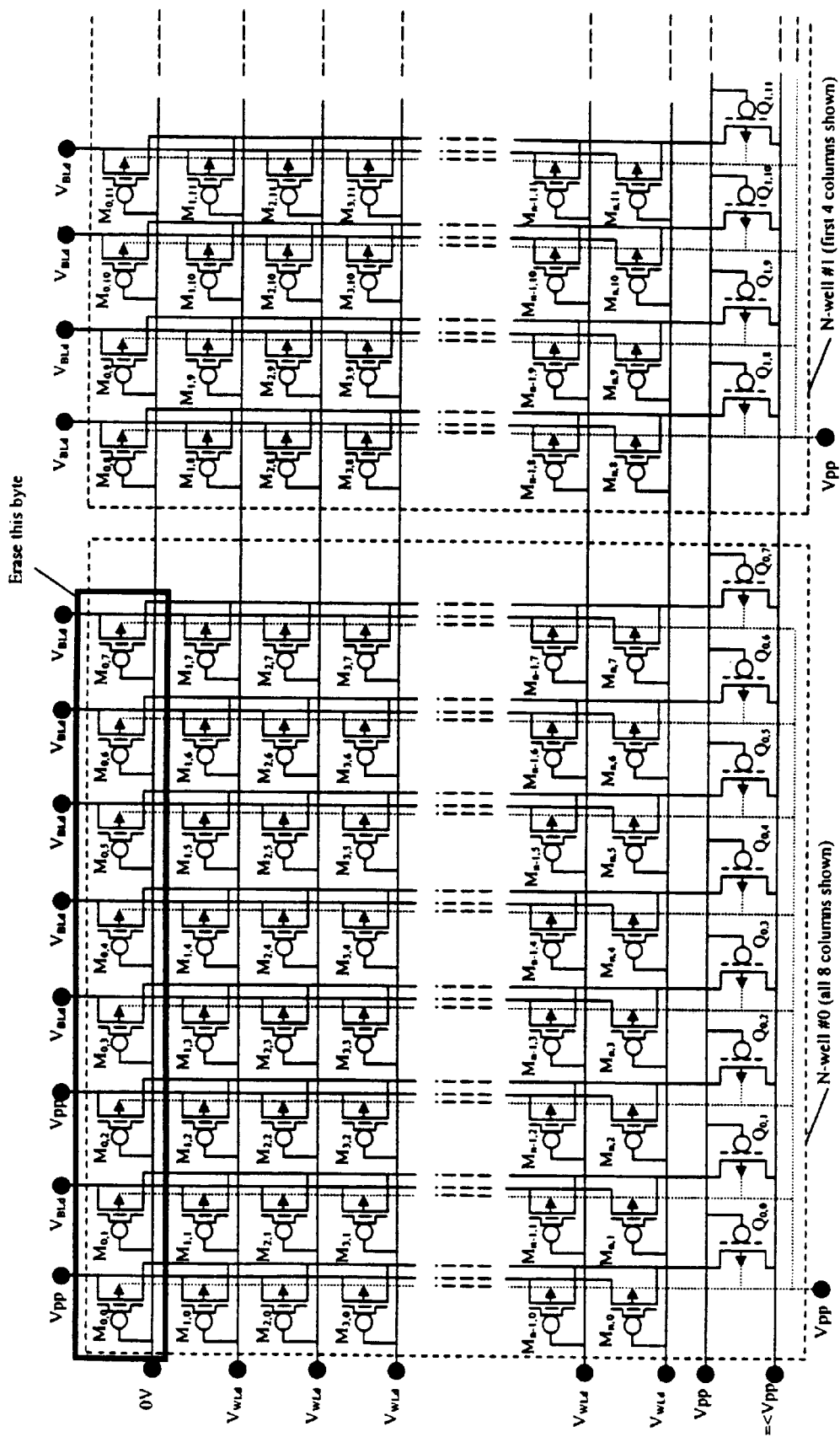
FIG. 9 is a schematic diagram corresponding to FIG. 5, but with the application of a voltage, $V_{WLd}$, during an erase operation.

Referring to FIGS. 5 and 9, it will be clearly understood by those skilled in the art that the program disturb problem can also occur in a case in which all memory cells are placed in a single semiconductor region, such as a single N-well region. As depicted in FIGS. 5 and 9, there would be only one semiconductor region, such as N-well #0 containing all cells of the memory. As an example, cells $M_{0,8} \ldots M_{0,11}$ would all be in the same semiconductor region with $M_{0,0}-M_{0,7}$, such as a common N-well. In such a case, however, program disturb only occurs during an erase operation, not during a write operation. This is because during a write operation the only word line set to Vpp is that for the row being written. In the erase operation, the word lines of all deselected (i.e., non-selected) rows are set to Vpp. Without employing the present invention, program disturb can occur in the cells of these rows. Applying the present invention to these rows minimizes program disturb from occurring during an erase operation.

Figure 8:
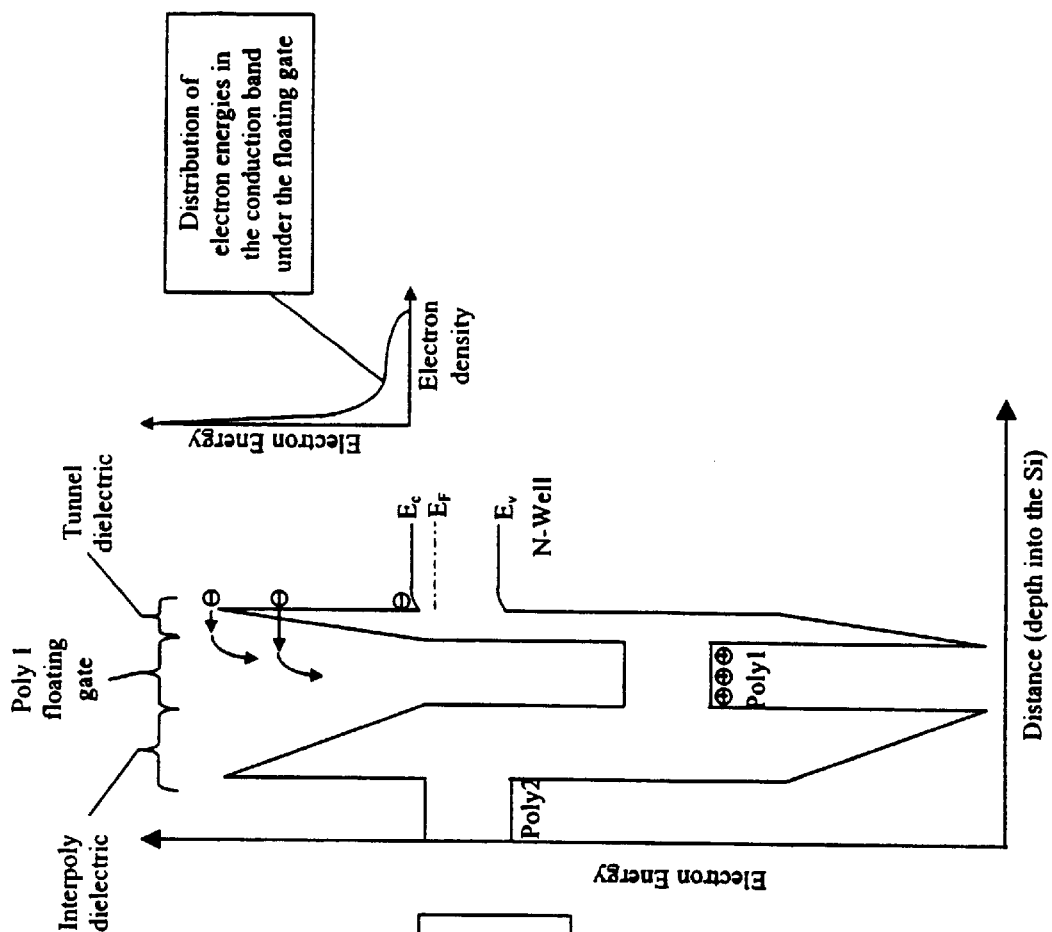
FIG. 8 is a band diagram schematically illustrating the concept of a population of electrons arriving at the silicon-tunnel dielectric interface with a distribution of energies.
Figure 7:
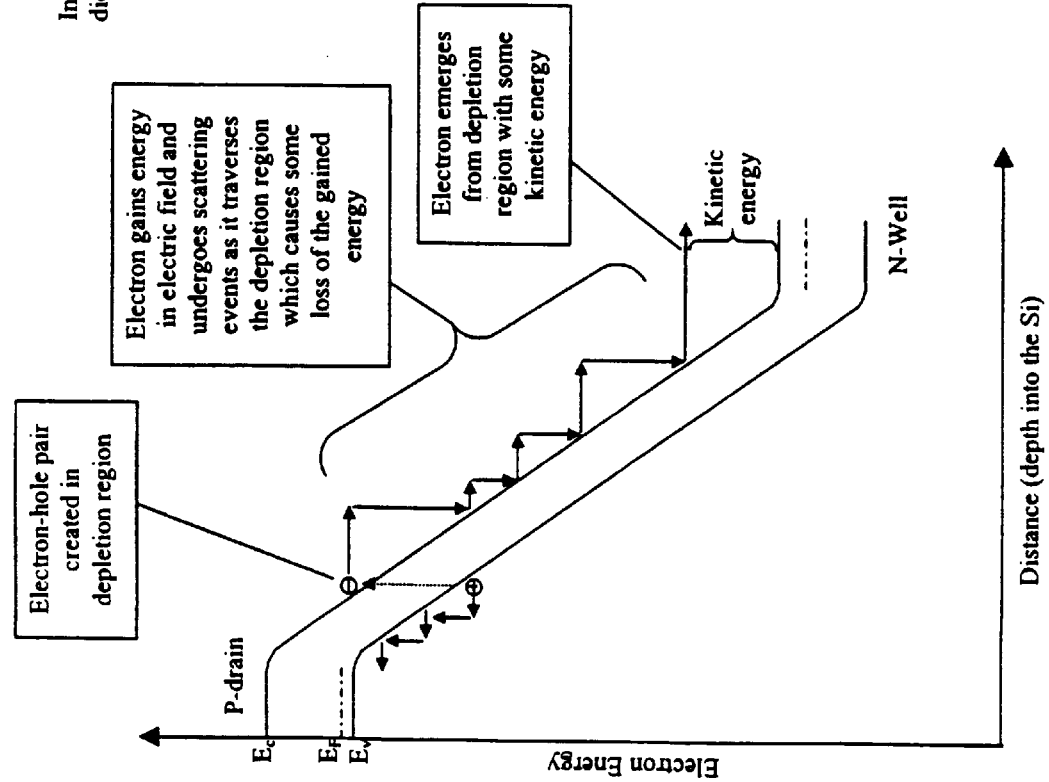
FIG. 7 is a band diagram illustrating the sequence of events leading up to an energetic electron arriving at the silicon-tunnel dielectric interface.

FIGS. 7 and 8 are energy band diagrams that illustrate the process of electrons gaining energy in the depletion region and surmounting the energy barrier. FIG. 7 illustrates the sequence of events leading up to an energetic electron arriving at the silicon-tunnel dielectric interface. First, an ehp is created in the depletion region. The electron is swept to the right by the electric field present in the depletion region and gains energy. As it traverses the depletion region, it undergoes scattering events and gives up some of its energy. It eventually reaches the edge of the depletion region and enters the neutral N-well with still some energy above the conduction band. FIG. 8 is a band diagram schematically illustrating the concept of a population of electrons arriving at the silicon-tunnel dielectric interface with a distribution of energies. The small inset graph of electron density versus energy placed level with the N-well conduction band illustrates the concept that there is a small "tail" in the distribution with large enough energy to surmount the barrier. Since there is a positive charge on the floating gate in the erased cell, it represents a potential well on the diagram and the positive charge also lowers the barrier of the tunnel dielectric at the top which aids electrons by a small amount. Two electrons are shown surmounting the barrier, one that has enough energy to completely go over the top and one near the top with enough energy to tunnel through the barrier aided by the electric field from the positive charge.

Given the above mechanisms for generating a population of energetic electrons near the floating gate, the present invention seeks to inhibit as many of these electrons from reaching the floating gate as possible. With $V_{NW}$=Vpp, this is accomplished by applying a voltage, $V_{WLd}$, which is more negative than Vpp to the deselected word lines during the erase operation. The practical range of $V_{WLd}$ is from Vpp–1V to Vpp–6V (factors affecting this range are discussed below). This reduces the attractive potential of the floating gate. In some cases, in fact, the floating gate potential may be reduced sufficiently to set up an electric field that repels electrons from the surface. In both cases, program disturb of the cell is reduced.

FIG. 9 is a schematic diagram corresponding to FIG. 5, but with the application of $V_{WLd}$ to deselected word lines instead of Vpp as in prior art structures. The bit lines of cells in the target byte which are not to be erased are set to $V_{BLd}$ as in the above-noted copending U.S. Patent Application filed concurrently herewith, and entitled "Improved Programming Method for a Memory Cell", both application assigned to the same assignee as the present application. The bit lines of cells in the target byte to be erased are set to Vpp.

Figure 11B:
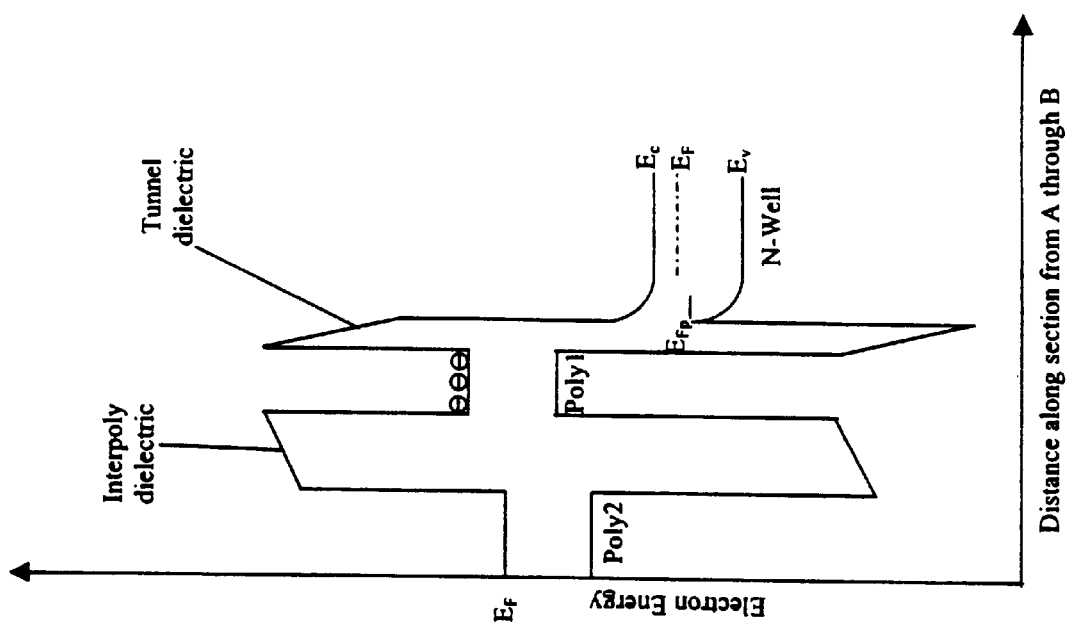
Figure 11A:
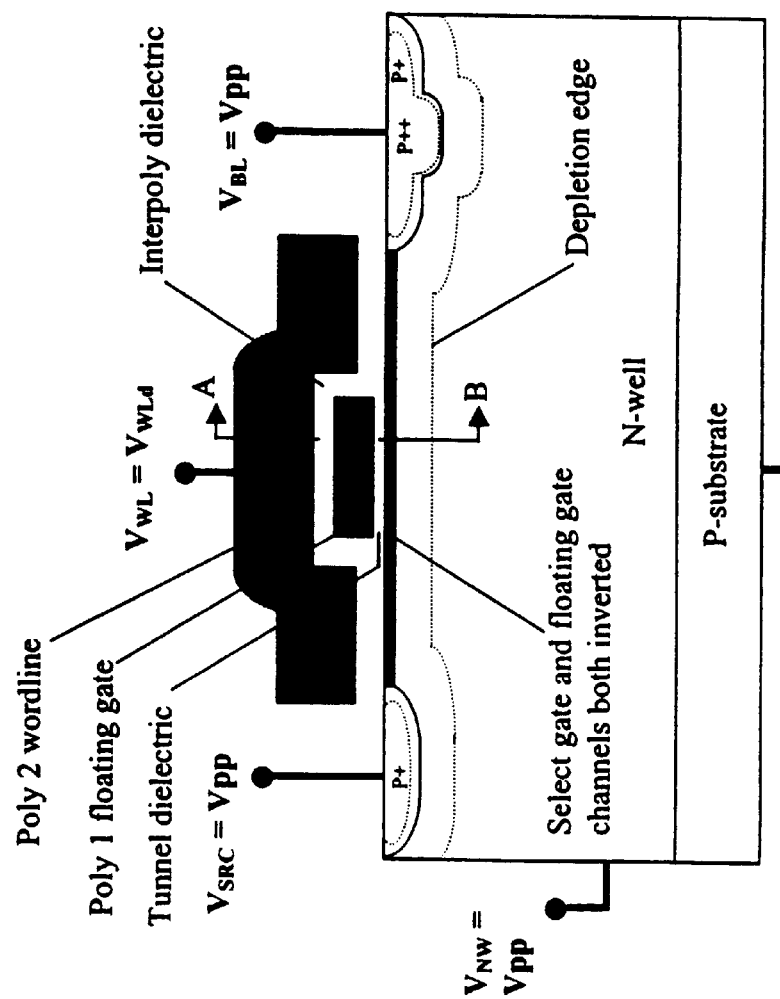
Figure 12B:
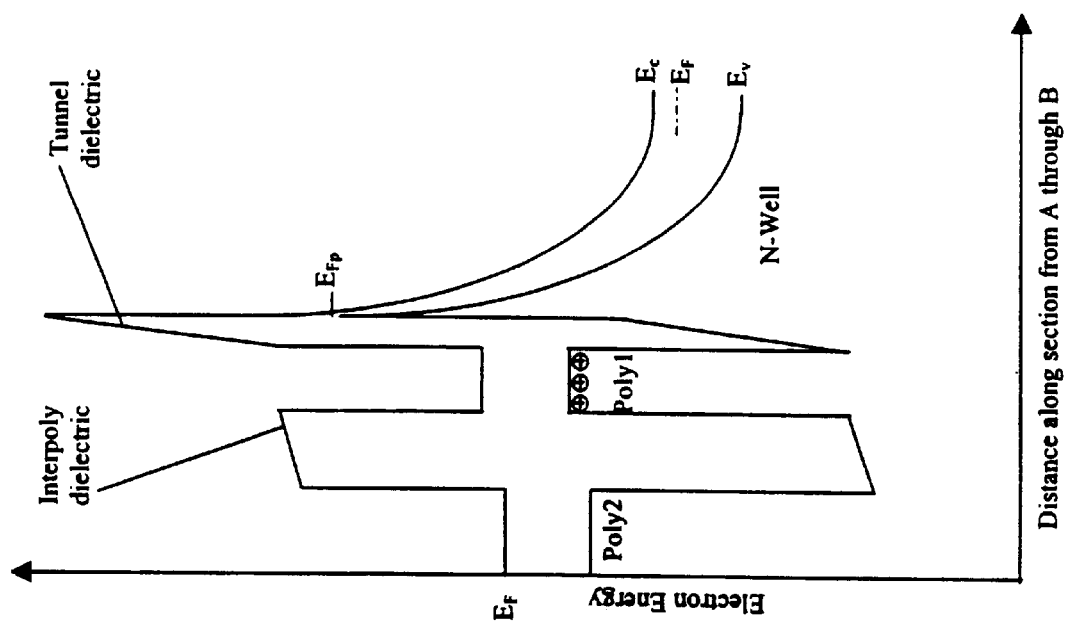
Figure 12A:
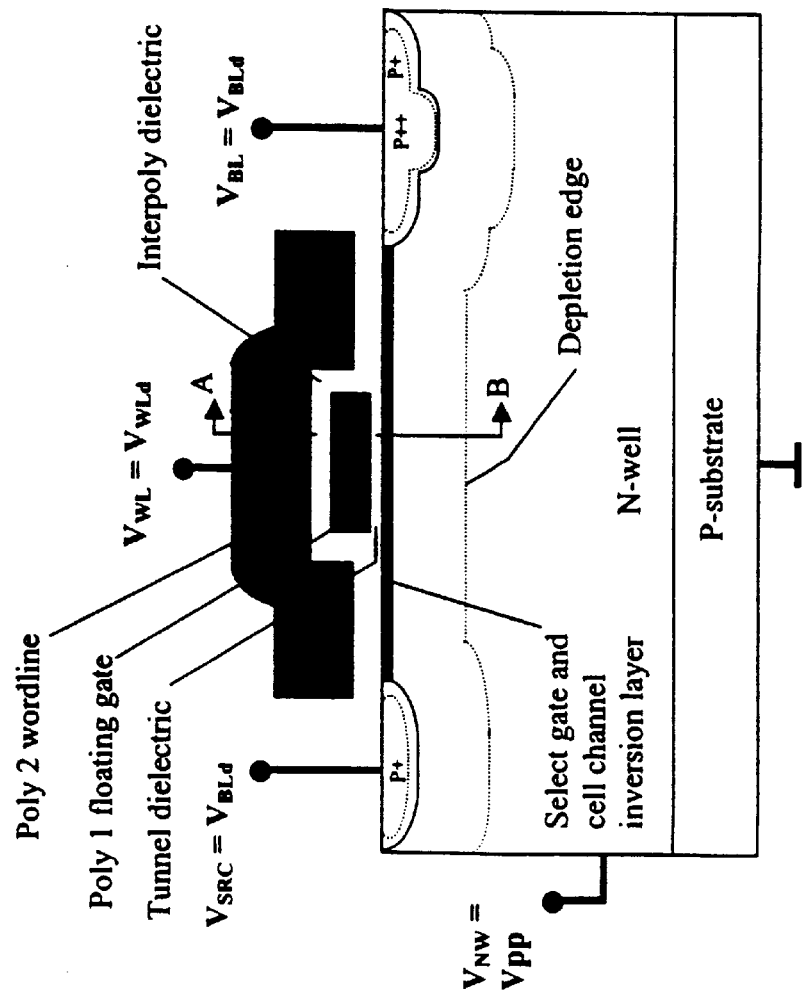
Figure 13B:
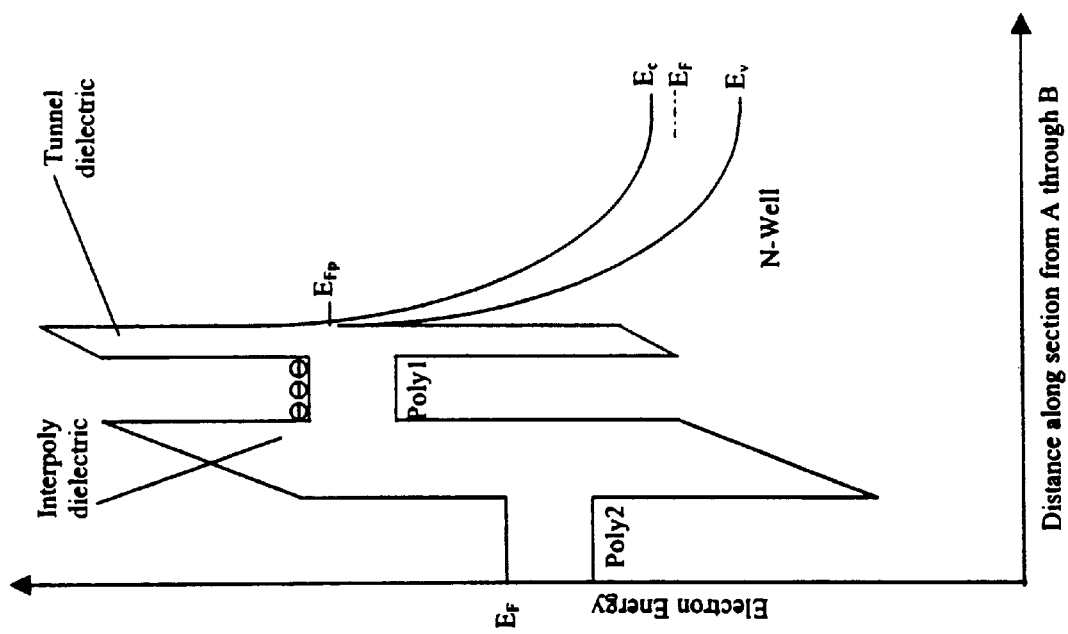
Figure 13A:
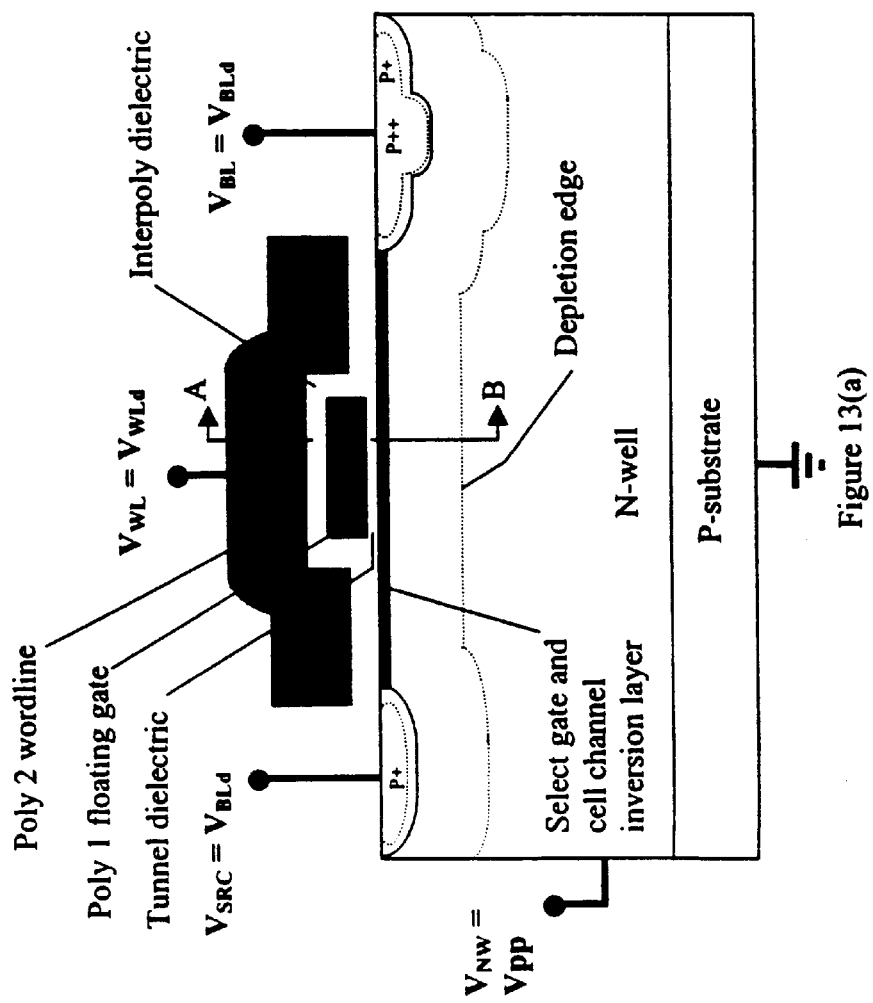

For an erase operation, there are four possible terminal voltage and floating gate potential combinations for cells sharing a deselected word line. The four possible conditions arise because, prior to the erase operation, a particular cell along the deselected word line may be in either the erased (positive charge on the floating gate) or in written (negative charge on the floating gate) state. In addition, the bit lines of the cells may be receiving either $V_{BL}$=Vpp or $V_{BL}$ in the range of 0 to $V_{BLd}$. These two bit line voltage possibilities exist because the bit lines of cells along the selected word line that are to be erased have $V_{BL}$=Vpp, while the bit lines of cells that are not to be erased have $V_{BL}$=0V (see FIG. 5), as in the prior art; or have a small positive voltage, $V_{BL}$=$V_{BLd}$, which is in the range of 2V–8V, as taught by the above-noted copending U.S. Patent Application filed concurrently herewith, and entitled "Improved Programming Method for a Memory Cell", both applications assigned to the same assignee as the present application FIGS. 10(a), 11(a), 12(a), and 13(a) are cross-sectional views of a cell along a deselected word line similar to FIG. 6, but with the different combinations of floating gate charge and $V_{BL}$. FIGS. 10(b), 11(b), 12(b), and 13(b) are band diagrams respectively corresponding to FIGS. 10(a), 11(a), 12(a), and 13(a) viewed through the floating gate region of the channel and perpendicular to the surface (section A–B in the figures). FIGS. 10 and 11 illustrate the case of $V_{BL}$=Vpp for positive or negative floating gate charge, respectively. FIGS. 12 and 13 illustrate the case of $V_{BL}$=$V_{BLd}$ for positive and negative floating gate charge, respectively.

FIGS. 10(a) and 10(b) are cross-sectional views of a cell on a deselected word line with Vpp applied to the bit line. An example of such a cell would be cell $M_{1,0}$ in FIG. 9. FIG. 10(a) shows an inversion layer in the select gate portions of the channel. This is because $V_{WLd}$ is assumed to be sufficiently lower in voltage than $V_{NW}$=Vpp that the threshold voltage of the select gate portion of the channel is exceeded. Since the threshold voltage of the select gate is typically in a range around –1V, this means that $V_{WLd}$ should preferably be 1V or more below Vpp. The N-well region under the floating gate, however, may be in accumulation, depletion, or inversion, depending upon the doping concentration in the N-well underneath the floating gate, the amount of positive charge on the floating gate, the gate coupling ratio, and $V_{WLd}$. In FIGS. 10(a) and 10(b), it is assumed that the surface is slightly depleted.

The difference between the FIG. 10(b) band diagram and that of FIG. 8 result from FIG. 8 being representative of the prior art with deselected word lines at $V_{WL}$=Vpp, and FIG. 10(b) being representative of an embodiment of the present invention with deselected word lines at $V_{WL}$=$V_{WLd}$. The more negative potential applied to the word line in FIG. 10(b) capacitively couples to the floating gate, raising its electron potential so as to compensate the attractive potential of the positive charge stored. It can be readily understood by one skilled in the art that with the N-well depleted near the surface, as in FIG. 10(b), there is an energy barrier to electrons in the neutral N-well. The electric field in the tunnel dielectric is also reversed so that it inhibits electron transport across this insulating barrier. Thus, the probability that an energetic electron injected into the N-well or created in the depletion region underneath the gate can surmount the tunnel dielectric and be collected on the floating gate is greatly reduced. Even if the surface of the N-well was in accumulation instead of depletion, the electric field in the tunnel dielectric would still be reduced compared to that in FIG. 8.

FIGS. 11(a) and 11(b) illustrate the same conditions as in FIGS. 10(a) and 10(b), except that there is now negative charge stored on the floating gate. This causes the potential of the poly 1 floating gate to be more negative, raising its energy on the band diagram of FIG. 11(b) above that shown in FIG. 10(b). This serves to repel energetic electrons injected into the neutral N-well or depletion region under the floating gate even more than the case of FIG. 10(b). In FIG. 11(a), the N-well surface underneath the poly 1 floating gate is inverted. This is expected since there is a negative stored charge and the word line is more negative than the N-well. This inversion layer is connected to the P+ drain region, which is connected to the bit line that is being held at a potential Vpp. Thus, the surface potential for holes is pinned and the quasi-Fermi level of holes at the surface, $E_{Fp}$, is indicated in FIG. 11(b).

FIGS. 11(a) and 11(b) show that energetic electrons injected into the N-well are repelled even more than those in FIGS. 10(a) and 10(b), thus reducing the program disturb even more for cells in this condition. FIGS. 11(a) and 11(b) also indicate that there is a lower limit on $V_{WLd}$ below which another disturb phenomena can occur. In FIG. 11(b), there is a large electric field in the tunnel dielectric directed so as to aid removal of electrons from the floating gate. This is due to the negative charge on the floating gate, but also to $V_{WLd}$ being more negative than $V_{NW}$=Vpp, which further increases the electric field across the tunnel dielectric. This raises a possibility that electrons will be lost from the floating gate by tunneling through the tunnel dielectric. The electric field required at which a large amount of normal Fowler-Nordheim tunneling current begins to flow is approximately $1\times10^7$ V/cm. This would be, for example, 10V across a 100-Angstrom-thick tunnel dielectric. If there was zero stored charge on the floating gate and the gate coupling ratio of the cell was 0.8, the potential difference between the surface of the N-well and the word line would need to be $V_{WLd}$=Vpp–12.5V. If there is stored negative charge on the floating gate, the electric field will be larger, so the potential difference between N-well surface and word line will need to be even less just to maintain an electric field of $1 \times 10^7$ V/cm. The needed reduction in potential difference depends upon the amount of stored negative charge, but typically would lie in the range of 2 to 6V. So, in the example given, the potential difference now lies in the range of $V_{WLd}$=Vpp–6.5V to Vpp–10.5V. Beyond these considerations and with many programming cycles, the cells in deselected word lines will undergo many cycles of this electric field stress, which add to form a cumulative stress time. The electric field allowed across the tunnel dielectric for this period of time must be low enough that the floating gate is not gradually discharged of electrons over the stress time. It is known to those skilled in the art that tunnel dielectrics that have been subjected to many programming cycles tend to exhibit increased current leakage at low electric fields. This is due to the Stress-Induced Leakage Current (SILC) effect widely reported in the published literature. Ultimately, this effect sets the upper limit on the electric field that the tunnel dielectric can be exposed to over the stress time before the floating gate loses enough electrons to cause program disturb of the cell. SILC can vary widely, depending upon the processing conditions used in the technology and the nature of the programming voltage signals. So, SILC should be characterized for the individual technology to which the present invention is being applied. A practical upper limit is VWLd=Vpp–6V.

FIG. 12(a) is a cross-sectional view of a cell along a deselected word line similar to FIG. 10(a), but with a different combination. FIG. 12(b) is a band diagram corresponding to FIG. 12(a) viewed through the floating gate region of the channel and perpendicular to the surface (section A–B in the figure). FIGS. 12(a) and 12(b) illustrate a cell on a deselected word line with $V_{BLd}$ applied to the bit line. An example of such a cell would be cell $M_{1,1}$ in FIG. 9. FIGS. 12(a) and 12(b) show the case of positive charge on the floating gate. It can be seen again that the select gate portion of the channel is inverted. If the portion of the channel under the floating gate is depleted, then the band diagram would be the same as in FIG. 10(b) and the same discussion as for that figure would apply. If we assume that this channel region is instead inverted, then the band diagram in FIG. 12(b) applies. The inversion layer under the poly 1 floating gate is connected to the bit line and this is held at a potential, $V_{BLd}$, which is in the range of 2 to 8V above ground and much lower than the N-well which is held at $V_{NW}$=Vpp. This causes a large amount of band bending in the N-well near the surface with the surface quasi-Fermi level for holes, $E_{Fp}$, pinned at $V_{BLd}$. This band bending imposes an even larger potential energy barrier to electrons in the N-well than that in FIGS. 10(b) or 11(b). Also, any ehp created in the surface depletion region would have the electrons swept away from the surface to the neutral N-well by the large electric field in the depletion region. Thus, cells in this condition are even less likely to be disturbed than those in the conditions of FIGS. 10 or 11.

FIGS. 13(a) and 13(b) illustrate the same conditions as in FIGS. 12(a) and 12(b), except that the charge on the floating gate is negative. Since there is an inversion layer under the floating gate which is again connected to the bit line voltage, $V_{BLd}$, this situation has the same consequences as the conditions in FIGS. 12(a) and 12(b). The negative floating gate charge simply increases the electric field in the interpoly dielectric and decreases the electric field in the tunnel dielectric. The interpoly dielectric is a much thicker insulating layer than the tunnel dielectric, and if it is a good quality insulator, as should be used in non-volatile memory technologies, it will be able to retain the stored electron charge.

In summary, the present invention reduces program disturb in EEPROM cells such as described in the above-noted prior art patents and patent applications. The application of a deselected word line bias, $V_{WLd}$, which is sufficiently below the programming voltage, Vpp, applied to the N-well acts to retard accumulation of energetic electrons generated in the reverse-biased source and drain p-n junctions. This reduces the gradual program disturb of the information stored on an erased cell, thus extending the number of programming cycles the memory can sustain.

What is claimed is:

1. A method of operating a memory including first and second groups of memory cells, cells of the first group formed in a first semiconductor region, including a target set of cells operatively coupled to a first word line and to respective first bit lines, and other cells operatively coupled to respective ones of the first bit lines and to respective ones of the remaining word lines, cells of the second group formed in a second semiconductor region, including a set of cells operatively coupled to the first word line and to respective second bit lines, and other cells operatively coupled to respective ones of the second bit lines and to respective ones of the remaining word lines, the method comprising:

applying a first voltage to the first word line;

applying a second voltage to the first semiconductor region;

applying selected voltages to the first bit lines;

applying a fourth voltage to the second semiconductor region;

applying a fifth voltage to the remaining word lines;

wherein during a first time, the first and fourth voltages are substantially the same, and the second and the selected voltages are substantially the same, and the fifth voltage is substantially the same as the second voltage, and wherein during a second time the second and fourth voltages are substantially the same and different from the first voltage, the fifth voltage is selected from the range of the first voltage to the second voltage, and the selected voltages being selected from the range of the first voltage and the second voltage.

2. A method of operating a memory according to claim 1, wherein during the first time, the first voltage is greater than the second voltage.

3. A method of operating a memory according to claim 1, wherein during the second time, first voltage is less than the second voltage.

4. A method of operating a memory according to claim 1, wherein the first and second times occur during programming of the memory.

5. A method of operating a memory according to claim 1, further comprising:

applying a sixth voltage to the second bit lines during the first and second times, wherein the sixth voltage is selected from the range of the first voltage to the second voltage.

6. A method of operating a memory according to claim 5, wherein during the first time, the first voltage is greater than the second voltage.

7. A method of operating a memory according to claim 5, wherein during the second time, first voltage is less than the second voltage.

8. A method of operating a memory according to claim 5, wherein the first and second times occur during programming of the memory.

9. A method of erasing memory cells in a memory including at least first and second groups of cells, cells of the first group formed in a first semiconductor region, including a target set of cells operatively coupled to a first word line and to respective first bit lines, and other cells operatively coupled to respective ones of the first bit lines and to respective ones of the remaining word lines, cells of the second group formed in a second semiconductor region, including a set of cells operatively coupled to the first word line and to respective second bit lines, and other cells operatively coupled to respective ones of the second bit lines and to respective ones of the remaining word lines, the method comprising:

applying a first voltage to the first word line;

applying a second voltage to the first semiconductor region;

applying selected voltages to the first bit lines;

applying a fourth voltage to the second semiconductor region;

applying a fifth voltage to the remaining word lines;

wherein the second and fourth voltages are substantially the same and different from the first voltage, the fifth voltage is selected from the range of the first voltage to the second voltage, and the selected voltages being selected from the range of the first voltage to the second voltage.

10. A method of erasing memory cells in a memory according to claim 9, wherein the first voltage is less than the second voltage.

11. A method of erasing memory cells in a memory according to claim 10, wherein the second voltage is positive.

12. A method of operating a memory according to claim 10, further comprising:

applying a sixth voltage to the second bit lines, wherein the sixth voltage is selected from the range of the first voltage to the second voltage.

13. A method of erasing memory cells formed in a semiconductor region, a first group of the cells operatively coupled to a first word line and to respective first bit lines, and other cells of the first group operatively coupled to respective ones of the first bit lines and to respective ones of the remaining word lines, the method comprising:

applying a first voltage to the word line;

applying a second voltage to the semiconductor region;

applying selected voltages to the first bit lines;

applying a fourth voltage to the remaining word lines;

wherein the first and second voltages are different, the fourth voltage selected from the range of the first voltage to the second voltage, and the selected voltages being selected from the first and second voltages.

14. A method of erasing a first group of memory cells in a memory according to claim 13, wherein the first voltage is less than the second voltage.

15. A method of erasing a first group of memory cells in a memory according to claim 14, wherein the second voltage is positive.

16. A method of erasing memory cells in a memory according to claim 13, further comprising:

applying a fifth voltage as one of the selected voltages to the first bit lines, wherein the fifth voltage is selected from the range of the first voltage to the second voltage.

* * * * *